US012615722B2

(12) United States Patent
Lee et al.

(10) Patent No.: US 12,615,722 B2
(45) Date of Patent: Apr. 28, 2026

(54) ELECTRONIC DEVICE INCLUDING CONNECTING MEMBER

(71) Applicant: SAMSUNG ELECTRONICS CO., LTD., Suwon-si (KR)

(72) Inventors: Kyuho Lee, Suwon-si (KR); Juntaek Oh, Suwon-si (KR); Jeonghoon Kim, Suwon-si (KR); Youngseok Bang, Suwon-si (KR); Yoseb Oh, Suwon-si (KR); Donguk Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 538 days.

(21) Appl. No.: 18/116,426

(22) Filed: Mar. 2, 2023

(65) Prior Publication Data

US 2023/0284400 A1 Sep. 7, 2023

Related U.S. Application Data

(63) Continuation of application No. PCT/KR2023/001916, filed on Feb. 9, 2023.

(30) Foreign Application Priority Data

Mar. 4, 2022 (KR) ........................ 10-2022-0028180
Apr. 5, 2022 (KR) ........................ 10-2022-0042336

(51) Int. Cl.
*H05K 5/00* (2025.01)
*H01Q 1/27* (2006.01)
(Continued)

(52) U.S. Cl.
CPC .......... *H05K 5/0086* (2013.01); *H01Q 1/273* (2013.01); *H05K 1/0277* (2013.01); *H05K 1/111* (2013.01);
(Continued)

(58) Field of Classification Search
CPC .... H05K 5/0086; H05K 1/0277; H05K 1/111; H05K 1/115; H05K 1/18; H05K 7/1427;
(Continued)

(56) References Cited

U.S. PATENT DOCUMENTS

2016/0127011 A1 5/2016 Phillips et al.
2016/0205461 A1 7/2016 Fernandez-Medina et al.
(Continued)

FOREIGN PATENT DOCUMENTS

KR 10-2017-0040625 A 4/2017
KR 10-2017-0074985 A 6/2017
(Continued)

OTHER PUBLICATIONS

Communication dated Mar. 10, 2025, issued by the European Patent Office in European Application No. 23763644.4.
(Continued)

*Primary Examiner* — Pete T Lee
(74) *Attorney, Agent, or Firm* — Sughrue Mion, PLLC

(57) ABSTRACT

An electronic device includes: a housing; a battery provided in the housing; an antenna; a printed circuit board including: a first surface facing the antenna; a second surface opposite to the first surface and facing the battery; a first region including a conductive pattern; and a second region including a dielectric material; a first connecting member provided on the first surface of the printed circuit board, the first connecting member electrically connecting the antenna and the printed circuit board; and a second connecting member provided on the second surface of the printed circuit board, the second connecting member electrically connecting the battery and the printed circuit board, wherein at least a portion of the second connecting member overlaps at least a portion of the first connecting member, and wherein the
(Continued)

second region is at least partially between the first connecting member and the second connecting member.

20 Claims, 12 Drawing Sheets

(51) Int. Cl.
*H05K 1/02* (2006.01)
*H05K 1/11* (2006.01)
*H05K 1/18* (2006.01)
*H05K 7/14* (2006.01)

(52) U.S. Cl.
CPC ............... *H05K 1/115* (2013.01); *H05K 1/18* (2013.01); *H05K 7/1427* (2013.01); *H05K 2201/10037* (2013.01); *H05K 2201/10098* (2013.01)

(58) Field of Classification Search
CPC .......... H05K 2201/10037; H05K 2201/10098; H01Q 1/273
See application file for complete search history.

(56) References Cited

U.S. PATENT DOCUMENTS

| | | |
|---|---|---|
| 2017/0064830 A1 | 3/2017 | Jiang et al. |
| 2018/0129170 A1 | 5/2018 | Yun et al. |
| 2018/0287302 A1 | 10/2018 | Kim et al. |
| 2019/0067795 A1 | 2/2019 | Shin et al. |
| 2020/0221209 A1 | 7/2020 | Grebe et al. |
| 2020/0374621 A1 | 11/2020 | Huang |
| 2021/0176557 A1 | 6/2021 | Schreuder |
| 2021/0219040 A1 | 7/2021 | Woo |
| 2022/0361319 A1 | 11/2022 | Park et al. |
| 2023/0137605 A1* | 5/2023 | Wang ..................... H01Q 1/273 455/41.2 |

FOREIGN PATENT DOCUMENTS

| | | | |
|---|---|---|---|
| KR | 10-2018-0000499 A | 1/2018 | |
| KR | 10-2018-0109444 A | 10/2018 | |
| KR | 10-2019-0022138 A | 3/2019 | |
| KR | 10-2021-0041572 A | 4/2021 | |
| KR | 10-2021-0099970 A | 8/2021 | |
| WO | WO-2020030576 A1 * | 2/2020 | ........... H04R 1/1058 |

OTHER PUBLICATIONS

International Search Report (PCT/ISA/210) dated May 12, 2023, issued by International Searching Authority in International Application No. PCT/KR2023/001916.

Written Opinion (PCT/ISA/237) dated May 12, 2023, issued by International Searching Authority in International Application No. PCT/KR2023/001916.

Communication issued Feb. 4, 2026 by the Korean Ministry of Intellectual Property in Korean Patent Application No. 10-2022-0042336.

* cited by examiner

ELECTRONIC DEVICE INCLUDING CONNECTING MEMBER

CROSS REFERENCE TO RELATED APPLICATIONS

This application is a continuation of International Application No. PCT/KR2023/001916 filed on Feb. 9, 2023, designating the United States, in the Korean Intellectual Property Receiving Office, and claiming priority to Korean Patent Application No. 10-2022-0028180 filed on Mar. 4, 2022, and Korean Patent Application No. 10-2022-0042336 filed on Apr. 5, 2022, the disclosures of which are all hereby incorporated by reference herein in their entireties.

BACKGROUND

1. Field

Various embodiments of the disclosure relate to an electronic device including a connecting member.

2. Description of Related Art

Electronic devices may refer to devices that perform functions based on embedded programs, such as home appliances, electronic notes, portable multimedia players (PMPs), mobile communication terminals, tablet personal computers (PCs), video/audio devices, desktop/laptop computers, vehicle navigation systems, and so forth. For example, these electronic devices may output stored information in the form of sound or images. With the increasing integration of electronic devices and the common use of ultra-high-speed and large-volume wireless communication, various functions have recently come to be provided in a single electronic device, such as a mobile communication terminal. For example, various functions such as an entertainment function such as gaming, a multimedia function such as music/video playback, a communication and security function for mobile banking, and a function such as a schedule management or electronic wallet, as well as a communication function have been integrated into a single electronic device. Such an electronic device becomes increasingly more compact so that the user can conveniently carry it. Along with the development of electronic and communication technologies, such electronic devices have been reduced in size and weight, so that the electronic devices can be used without any inconvenience even in the state in which the electronic devices are worn on a body.

SUMMARY

According to an aspect of the disclosure, an electronic device includes: a housing; a battery provided in the housing; an antenna configured to communicate with an external electronic device; a printed circuit board including: a first surface facing the antenna; a second surface opposite to the first surface and facing the battery; a first region including a conductive pattern; and a second region including a dielectric material; a first connecting member provided on the first surface of the printed circuit board, the first connecting member electrically connecting the antenna and the printed circuit board; and a second connecting member provided on the second surface of the printed circuit board, the second connecting member electrically connecting the battery and the printed circuit board, wherein at least a portion of the second connecting member overlaps at least a portion of the first connecting member, and wherein the second region is at least partially between the first connecting member and the second connecting member.

According to an aspect of the disclosure, an electronic device includes: a housing; a battery provided in the housing; an antenna; a printed circuit board provided between the battery and the antenna, the printed circuit board including: a first pad facing the antenna; a second pad facing the battery; a first region including a conductive pattern; and a second region between the first pad and the second pad and at least partially surrounded by the conductive pattern; a first connecting member provided on the first pad and electrically connected to the antenna; and a second connecting member provided on the second pad and electrically connected to the battery.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
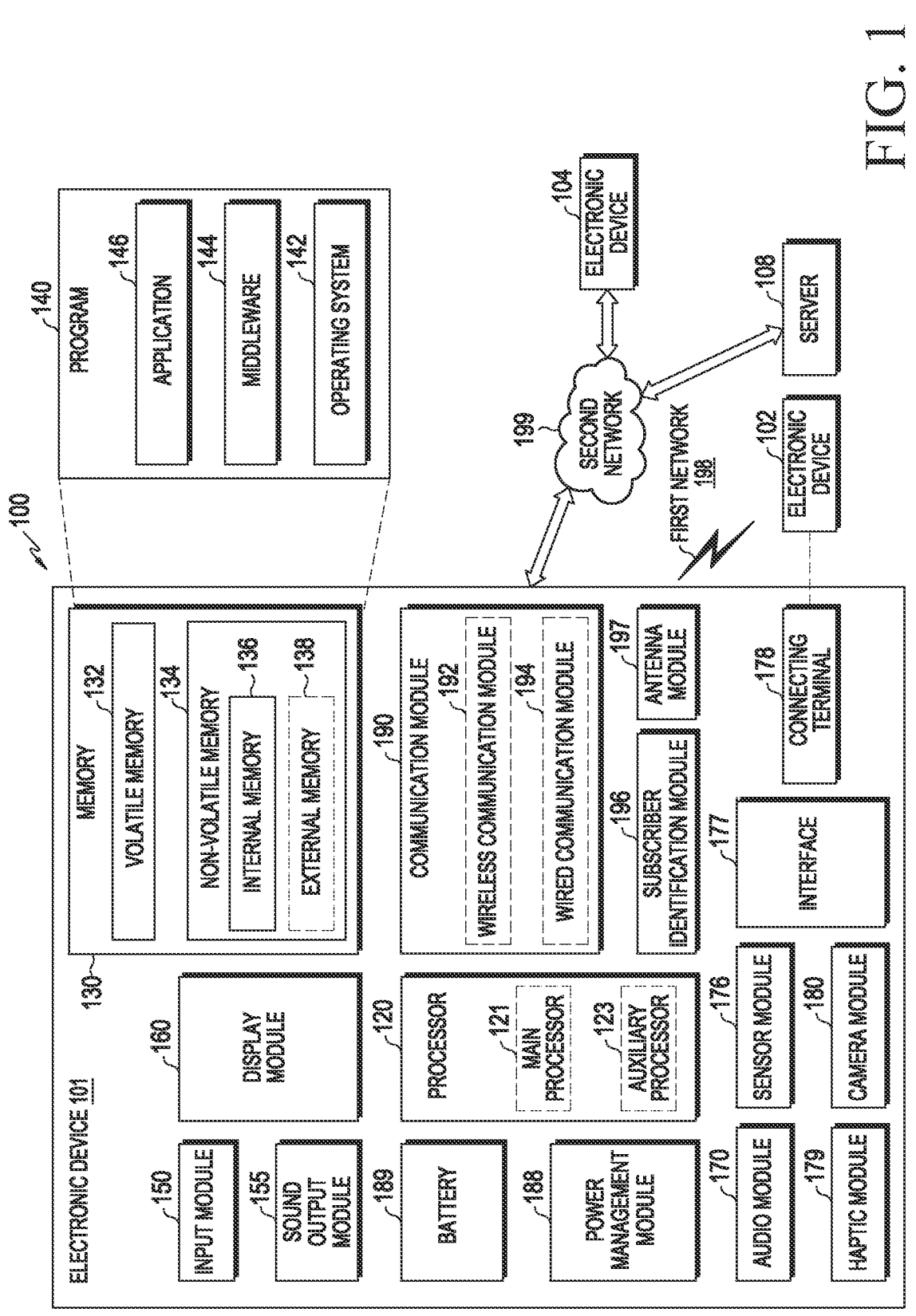
FIG. 1 is a block diagram of an electronic device in a network environment according to various embodiments of the disclosure.

FIG. 1 is a block diagram illustrating an electronic device in a network environment according to various embodiments of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

An electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
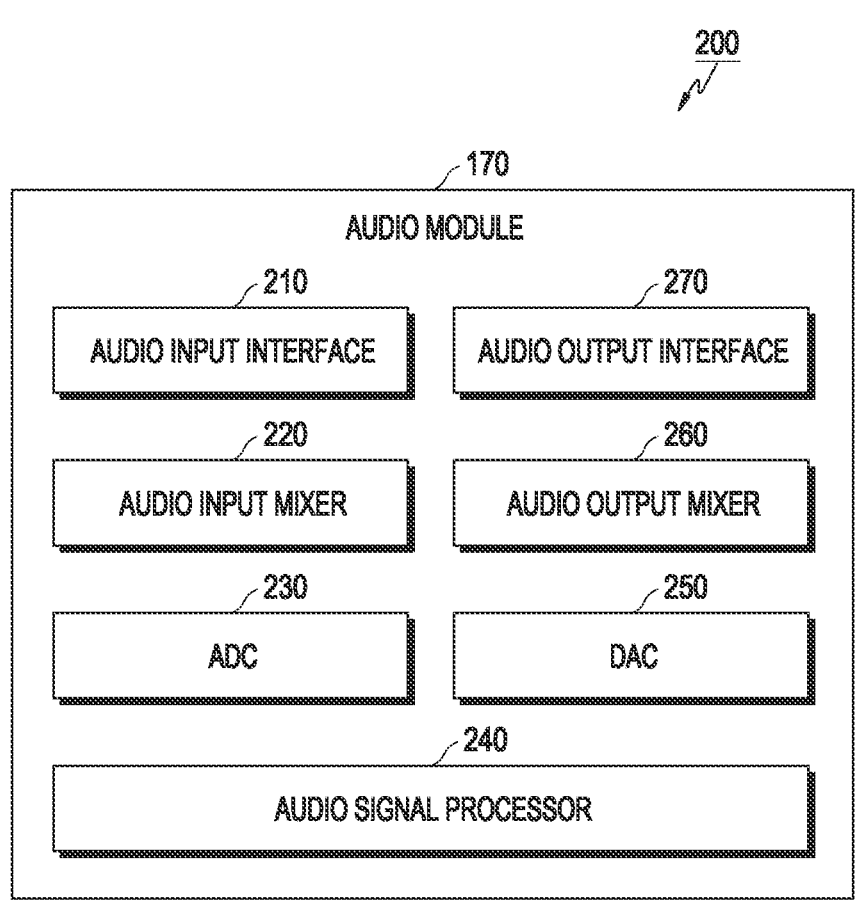
FIG. 2 is a block diagram of an audio module according to various embodiments of the disclosure.

FIG. 2 is a block diagram 200 illustrating the audio module 170 according to various embodiments. Referring to FIG. 2, the audio module 170 may include, for example, an audio input interface 210, an audio input mixer 220, an analog-to-digital converter (ADC) 230, an audio signal processor 240, a digital-to-analog converter (DAC) 250, an audio output mixer 260, or an audio output interface 270.

The audio input interface 210 may receive an audio signal corresponding to a sound obtained from the outside of the electronic device 101 via a microphone (e.g., a dynamic microphone, a condenser microphone, or a piezo microphone) that is configured as part of the input device 150 or separately from the electronic device 101. For example, if an audio signal is obtained from the external electronic device 102 (e.g., a headset or a microphone), the audio input interface 210 may be connected with the external electronic device 102 directly via the connecting terminal 178, or wirelessly (e.g., Bluetooth™ communication) via the wireless communication module 192 to receive the audio signal. According to an embodiment, the audio input interface 210 may receive a control signal (e.g., a volume adjustment signal received via an input button) related to the audio signal obtained from the external electronic device 102. The audio input interface 210 may include a plurality of audio input channels and may receive a different audio signal via a corresponding one of the plurality of audio input channels, respectively. According to an embodiment, additionally or alternatively, the audio input interface 210 may receive an audio signal from another component (e.g., the processor 120 or the memory 130) of the electronic device 101.

The audio input mixer 220 may synthesize a plurality of inputted audio signals into at least one audio signal. For example, according to an embodiment, the audio input mixer 220 may synthesize a plurality of analog audio signals inputted via the audio input interface 210 into at least one analog audio signal.

The ADC 230 may convert an analog audio signal into a digital audio signal. For example, according to an embodiment, the ADC 230 may convert an analog audio signal received via the audio input interface 210 or, additionally or alternatively, an analog audio signal synthesized via the audio input mixer 220 into a digital audio signal.

The audio signal processor 240 may perform various processing on a digital audio signal received via the ADC 230 or a digital audio signal received from another component of the electronic device 101. For example, according to an embodiment, the audio signal processor 240 may perform changing a sampling rate, applying one or more filters, interpolation processing, amplifying or attenuating a whole or partial frequency bandwidth, noise processing (e.g., attenuating noise or echoes), changing channels (e.g., switching between mono and stereo), mixing, or extracting a specified signal for one or more digital audio signals. According to an embodiment, one or more functions of the audio signal processor 240 may be implemented in the form of an equalizer.

The DAC 250 may convert a digital audio signal into an analog audio signal. For example, according to an embodiment, the DAC 250 may convert a digital audio signal processed by the audio signal processor 240 or a digital audio signal obtained from another component (e.g., the processor 120 or the memory 130) of the electronic device 101 into an analog audio signal.

The audio output mixer 260 may synthesize a plurality of audio signals, which are to be outputted, into at least one audio signal. For example, according to an embodiment, the audio output mixer 260 may synthesize an analog audio signal converted by the DAC 250 and another analog audio signal (e.g., an analog audio signal received via the audio input interface 210) into at least one analog audio signal.

The audio output interface 270 may output an analog audio signal converted by the DAC 250 or, additionally or alternatively, an analog audio signal synthesized by the audio output mixer 260 to the outside of the electronic device 101 via the sound output device 155. The sound output device 155 may include, for example, a speaker, such as a dynamic driver or a balanced armature driver, or a receiver. According to an embodiment, the sound output device 155 may include a plurality of speakers. In such a case, the audio output interface 270 may output audio signals having a plurality of different channels (e.g., stereo channels or 5.1 channels) via at least some of the plurality of speakers. According to an embodiment, the audio output interface 270 may be connected with the external electronic device 102 (e.g., an external speaker or a headset) directly via the connecting terminal 178 or wirelessly via the wireless communication module 192 to output an audio signal.

According to an embodiment, the audio module 170 may generate, without separately including the audio input mixer 220 or the audio output mixer 260, at least one digital audio signal by synthesizing a plurality of digital audio signals using at least one function of the audio signal processor 240.

According to an embodiment, the audio module 170 may include an audio amplifier (not shown) (e.g., a speaker amplifying circuit) that is capable of amplifying an analog audio signal inputted via the audio input interface 210 or an audio signal that is to be outputted via the audio output interface 270. According to an embodiment, the audio amplifier may be configured as a module separate from the audio module 170.

Figure 3A:
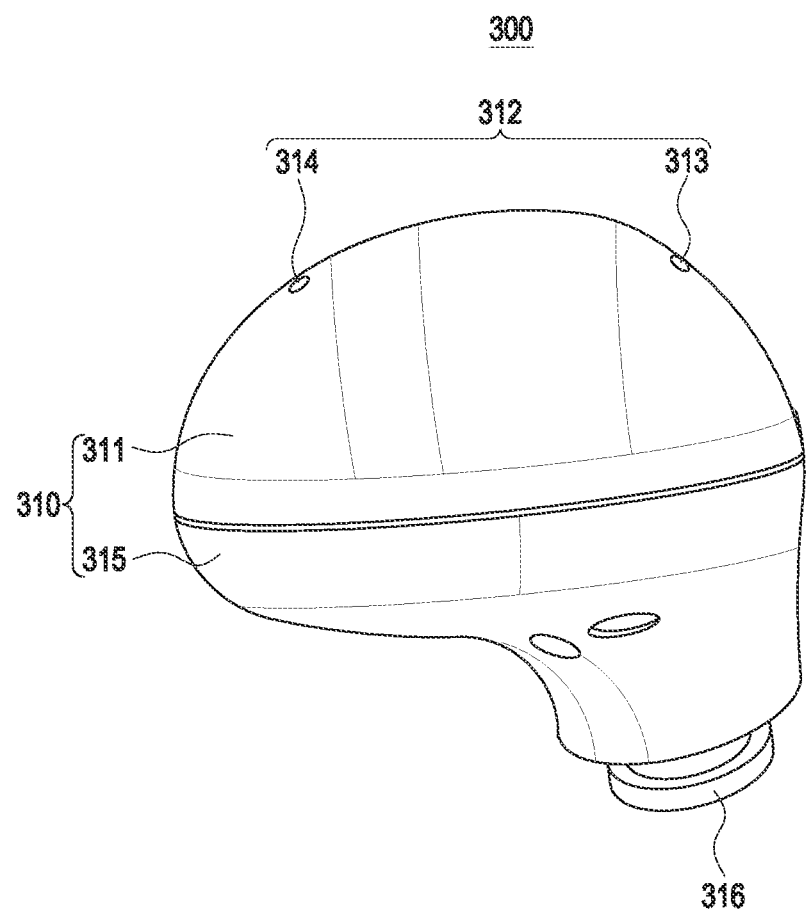
FIG. 3A is a side view of an electronic device according to various embodiments of the disclosure.
Figure 3B:
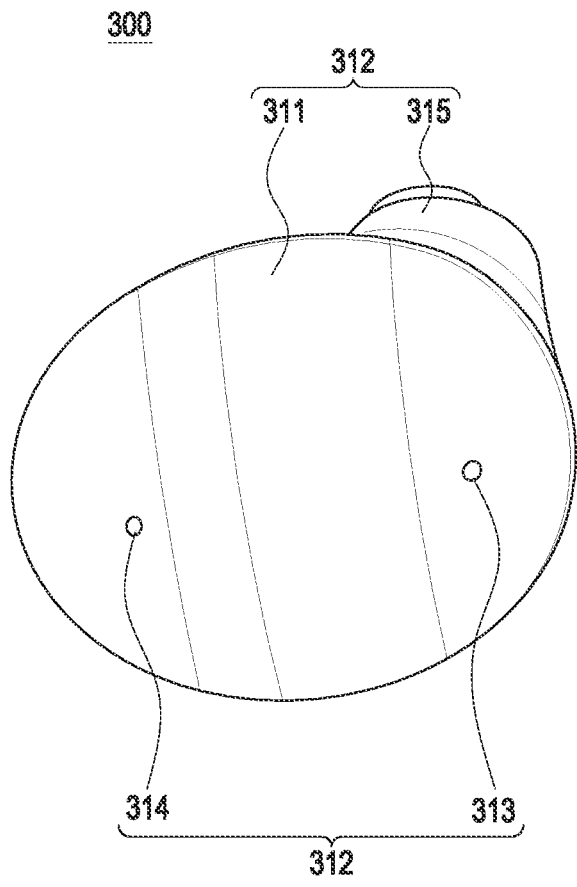
FIG. 3B is a top view of the electronic device according to various embodiments of the disclosure.

FIG. 3A is a side view of an electronic device according to various embodiments of the disclosure, and FIG. 3B is a top view of the electronic device according to various embodiments of the disclosure.

Referring to FIGS. 3A and 3B, the electronic device 300 may include a housing 310 for accommodating components of the electronic device 300. For example, sound components (e.g., the audio module 170 of FIG. 2) and/or electronic components (e.g., the processor 120, the power management module 188, and the battery 189, or a wireless communication module 192 of FIG. 1) may be disposed in the housing 310. The configurations of the electronic device 300 of FIGS. 3A and 3B may be substantially the same as all or some of the configurations of the electronic device 101 of FIG. 1.

According to an embodiment, the electronic device 300 may be a wearable electronic device. For example, the electronic device 300 may be worn on a part of a user's body, for example, such as ears or a head. According to an embodiment, the electronic device 300 may include an in-ear earset, an in-ear headset or a hearing aid.

According to an embodiment, the electronic device 300 may be asymmetric in shape, as shown in FIGS. 3A and 3B. According to an embodiment, the electronic device 300 is ergonomically designed such that the electronic device 300 is configured to be asymmetric in shape, thereby improving a user's convenience and comfort. According to an embodiment, since the electronic device 300 is configured to be asymmetric in shape, sound components (e.g., the audio module 170 of FIG. 2) and electronic components (e.g., the processor 120 of FIG. 1) in the housing 310 may be disposed to improve sound performance.

According to an embodiment, the electronic device 300 may be electrically connected to an external electronic device (e.g., the electronic device 102 of FIG. 1). According to an embodiment, the electronic device 300 may function as an audio output interface (e.g., the sound output module 155 of FIG. 1) that outputs a sound signal received from the external electronic device 102 to the outside.

Additionally or alternatively, the electronic device 300 may function as an audio input interface (or the input module 150 of FIG. 1) configured to receive an audio signal corresponding to a sound obtained from the outside of the electronic device 300.

According to an embodiment, the electronic device 300 may communicate with the external electronic device 102 or may be controlled by the external electronic device 102. The electronic device 300 may be an interaction-type electronic device that is paired with an external electronic device such as a smart phone through a communication method such as Bluetooth™, to convert data received from the external electronic device 102 to output a sound, or to receive a user's voice to transmit the received voice to the external electronic device 102.

According to an embodiment, the electronic device 300 may be wirelessly connected to the external electronic device 102 through a communication module (e.g., the communication module 190 of FIG. 1). For example, the electronic device 300 may communicate with the external electronic device 102 through a network (e.g., a short-range wireless communication network or a long-range wireless communication network). The network may include, but is not limited to, a mobile or cellular communication network, a local area network (LAN) (e.g., Bluetooth™ communication), a wireless local area network (WLAN), a wide area network (WAN), the Internet, or a small area network (SAN). According to an embodiment, the electronic device 300 may be wiredly connected to the external electronic device 102 using a cable.

According to another embodiment, the electronic device 300 may not communicate with the external electronic device 102. In this case, the electronic device 300 is not controlled by the external electronic device 102, and may be implemented to receive a signal corresponding to a sound obtained from the outside according to operations (or control) of components per se included in the electronic device 300, and output the sound signal to the outside. For example, the electronic device 300 may be a stand-alone electronic device that plays music or video back by itself without communicating with the external electronic device 102 to output a corresponding sound or to receive and process a user's voice.

In various drawings of the disclosure, as an example of the electronic device 300, a kernel-type in-ear earset configured to be mounted in an external auditory meatus starting from a pinna to a tympanic membrane will be mainly described. However, it should be noted that embodiments of the disclosure are not limited thereto. According to an embodiment, the electronic device 300 may be also an open-type earset configured to be mounted on the pinna.

According to various embodiments, the housing 310 may include a plurality of components. For example, the housing 310 may include a first housing 311 and a second housing 315 connected with the first housing 311. According to an embodiment, the first housing 311 and the second housing 315 may form at least a portion of an external appearance of the electronic device 300 and form an inner space in which components of the electronic device 300 may be accommodated. According to an embodiment, when the electronic device 300 is worn on the user, at least a portion of the second housing 315 may contact or face the user's body (e.g., an ear), and at least a portion of the first housing 311 may face an opposite direction to the user.

According to various embodiments, the housing 310 may include a microphone hole 312. According to an embodiment, the microphone hole 312 may be interpreted as a through hole formed in the first housing 311. According to an embodiment, the external sound of the electronic device 300 may be transmitted to a microphone module disposed inside the electronic device 300 via the microphone hole 312. According to an embodiment, the microphone hole 312 may include a plurality of microphone holes (313 and 314). For example, the microphone hole 312 may include a first microphone hole 313 and/or a second microphone hole 314 spaced apart from the first microphone hole 313.

According to various embodiments, the housing 310 may include a protrusion 316. According to an embodiment, at least a portion of the protrusion 316 may be inserted into the user's body (e.g., an ear). For example, the electronic device 300 may be inserted and mounted in the user's body (e.g., the external auditory meatus or pinna of the user's body) using the protrusion 316. According to an embodiment, the protrusion 316 may be interpreted as a part of the housing 310 extending from the second housing 315. According to an embodiment, an ear tip may be additionally mounted to the protrusion 316, and the electronic device 300 may be in close contact with the user's ear using the ear tip. According to an embodiment, the protrusion 316 may include at least one recess, and a sound output from a speaker module (e.g., the audio module 170 of FIG. 2) disposed inside the electronic device 300 may be radiated to the outside of the electronic device 300 using the recess positioned in the protrusion 316.

Figure 4:
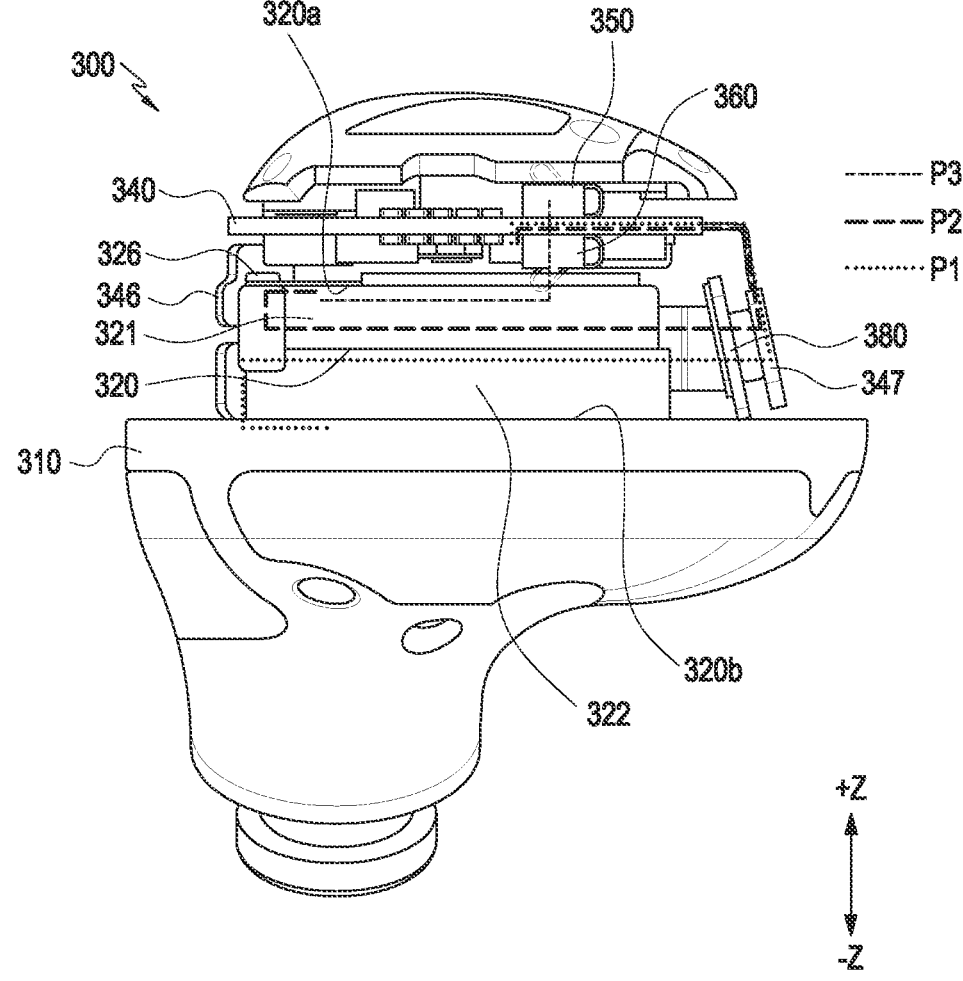
FIG. 4 is a side view of an electronic device in which a part of a housing is excluded, according to an embodiment of the disclosure.
Figure 5:
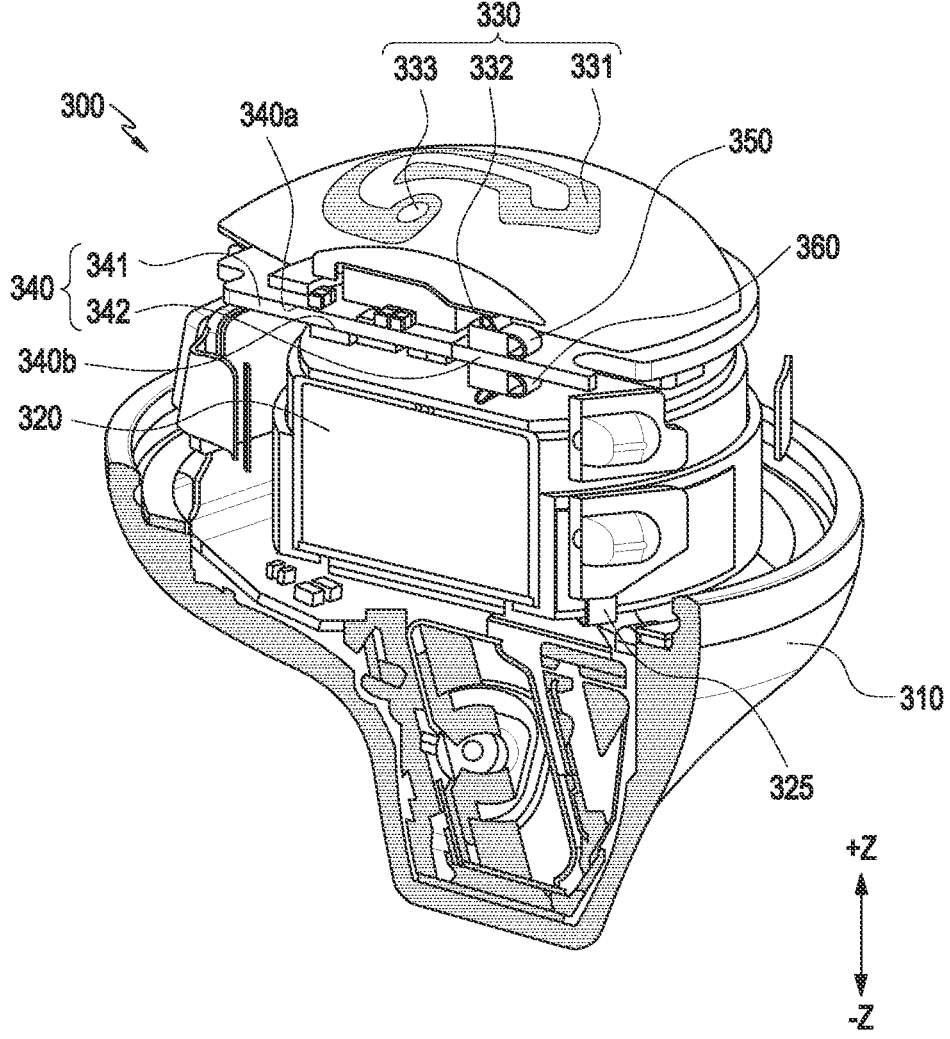
FIG. 5 is a cross-sectional perspective view of an electronic device in which a part of a housing is excluded, according to an embodiment of the disclosure.

FIG. 4 is a side view of an electronic device in which a part of a housing is excluded, according to an embodiment of the disclosure, and FIG. 5 is a cross-sectional perspective view of an electronic device in which a part of a housing is excluded, according to an embodiment of the disclosure.

Referring to FIGS. 4 and 5, the electronic device 300 may include a housing 310, a battery 320, an antenna 330, a printed circuit board 340, a first connecting member 350, and a second connecting member 360. The configurations of the electronic device 300 and the housing 310 of FIGS. 4 and 5 may be entirely or partially the same as the configurations of the electronic device 300 and the housing 310 of FIGS. 3A and 3B. The configurations of the antenna 330 shown in FIGS. 4 and 5 may be entirely or partially the same as the configurations of the antenna module 197 of FIG. 1. The configurations of the battery 320 of FIGS. 4 and 5 may be entirely or partially the same as the configurations of the battery 189 of FIG. 1.

According to an embodiment, the battery 320 may be disposed in the housing 310. According to an embodiment, the battery 320 may be a coin cell battery. The coin cell battery may be formed by winding or stacking a positive electrode plate, a negative electrode plate, and a separator, which are formed of thin plates or layers. For example, the coin cell battery may be a jelly-roll type electrode assembly in which a stacked structure of the positive electrode plate, the negative electrode plate, and the separator is rolled. As another example, the coin cell battery may be a stacked type electrode assembly in which a stacked structure of the positive electrode plate, the negative electrode plate, and the separator is stacked. According to an embodiment, the battery 320 may include a sealing member (e.g., CAN) for protecting a battery cell by surrounding at least a portion of the battery cell and preventing an electrolytic solution from leaking inside the battery cell.

According to an embodiment, the battery 320 may include a first battery surface 320a facing a first direction (e.g., +Z direction) and a second battery surface 320b facing a second direction (−Z direction) opposite to the first direction (+Z direction). The battery 320 may include a first electrode 321 (e.g., a negative electrode) located on the first battery surface 320a and a second electrode 322 (e.g., a positive electrode) located on the second battery surface 320b. According to an embodiment, the coin cell battery is provided with a tab and a lead of the positive electrode on a side of the battery cell, and a direction in which the tab and the lead of the positive electrode (hereinafter, simply referred to as 'positive electrode') are formed may be a direction opposite to a tab and a lead of the negative electrode (hereinafter, simply referred to as 'negative electrode') provided on the other side of the battery cell. For example, a bidirectional electrode terminal may be applied to the coin cell battery. According to an embodiment, a negative terminal may be formed on one surface (e.g., the first battery surface 320a) of the battery 320, and a positive terminal may be formed on the other surface (e.g., the second battery surface 320b) of the battery 320 facing the opposite direction of the one surface thereof.

According to an embodiment, since the coin cell battery is relatively small in size, it may be difficult to include a protection circuit module (PCM) (e.g., the power management module 380 of FIG. 8) in the battery cell or adjacent to the outside of the battery. Accordingly, according to various embodiments of the disclosure, the electronic device 300 may include a printed circuit board 340 and/or a flexible printed circuit board 346, on which the power management module 380 is disposed. Herein, the protection circuit module may perform an overcharge protection voltage function, an over-discharge protection voltage function, an overcurrent protection/detection current function, and/or a short protection/detection condition function. Additionally or alternatively with respect to the above various functions, the protection circuit module may monitor information about the battery (e.g., charge/discharge state, voltage, temperature, or pressure), and operate as a battery management system (BMS) that includes a function of transmitting or controlling information of the battery 320 by using wired/wireless communication, the remaining capacity of the battery 320, available battery time, or a function of managing a charge/discharge history. Therefore, in describing the following embodiments, the protection circuit module may be referred to as a "power management module" and/or a "power management circuit".

According to an embodiment, the electronic device 300 may implement various wireless communication methods including Bluetooth™ by using the antenna 330. According to an embodiment, the antenna 330 may be a laser direct structuring (LDS) antenna provided in the housing 310. For example, the antenna 330 may be an antenna pattern plated using a laser on at least a portion of the housing 310 formed of a thermoplastic resin (e.g., polycarbonate). The antenna 330 may include copper and/or nickel.

According to an embodiment, the antenna 330 may be disposed on a surface of the electronic device 300, for example, on one side of the housing 310 or adjacent to the housing 310 for ease of radiation. The antenna 330 may be disposed to be spaced apart from the printed circuit board 340 on which various electronic components including a processor (e.g., the communication processor) and a communication module (e.g., the communication module 190) for controlling the antenna 330 are disposed. According to an embodiment, the antenna 330 may be disposed in the first direction (+Z direction) of the printed circuit board 340. For example, the antenna 330 may be disposed to be spaced a predetermined distance apart from a surface facing the first direction (+Z direction) of the printed circuit board 340.

According to an embodiment, the antenna 330 may include an upper antenna pattern 331 located on the surface of the housing 310, a lower antenna pattern 332 spaced apart from the upper antenna pattern 331, and a via structure 333 for electrically connecting the upper antenna pattern 331 and the lower antenna pattern 332. According to an embodiment, the upper antenna pattern 331 may be disposed closer than the lower antenna pattern 332 to the surface of the housing 310. According to an embodiment, the lower antenna pattern 332 may be electrically connected to the first connecting member 350.

According to an embodiment, the printed circuit board 340 may accommodate electronic components for operations of the electronic device 300. For example, the printed circuit board 340 may accommodate a processor (e.g., the processor 120 of FIG. 1) and/or an audio module (e.g., the audio module 170 of FIG. 2). According to an embodiment, the printed circuit board 340 may be disposed between the battery 320 and the antenna 330. For example, the printed circuit board 340 may include a first surface 340a facing the antenna 330 and a second surface 340b facing the battery 320.

According to an embodiment, the electronic device 300 may include a flexible printed circuit board 346 for electrically connecting the printed circuit board 340 and the battery 320. According to an embodiment, the flexible printed circuit board 346 may be connected to the first electrode 321 and the second electrode 322 of the battery 320.

According to an embodiment, power of the battery 320 may be transmitted to the printed circuit board 340 using the flexible printed circuit board 346. For example, the electronic device 300 may include a first path P1 extending from the second electrode 322 (e.g., a positive electrode) of the battery 320 to the printed circuit board 340, and a second path P2 extending from the first electrode 321 (e.g., a negative electrode) of the battery 320 to the printed circuit board 340. According to one embodiment, the first path P1 may be electrically connected to the printed circuit board 340 via an electrode tab (e.g., the positive electrode tab 325 of FIG. 5 and/or the negative electrode tab 326 of FIG. 4) connected to the second electrode 322, the flexible printed circuit board 346, and a connector 347. According to an embodiment, the second path P2 may be electrically connected to the printed circuit board 340 via an electrode tab (325, 326) connected to the first electrode 321, the flexible printed circuit board 346, and the connector 347. According to an embodiment, the first path P1 and the second path P2 may be located on the same layer of the flexible printed circuit board 346. For example, the first path P1 and the second path P2 may be located in different regions of the same layer of the flexible printed circuit board 346. According to another embodiment, the first path P1 and the second path P2 may be located on different layers of the flexible printed circuit board 346.

According to various embodiments, the battery 320 and/or the printed circuit board 340 may provide a reference potential to an electronic component (e.g., the processor 120 of FIG. 1 or the audio module 170 of FIG. 2) and/or the antenna 330. According to an embodiment, the electronic device 300 may include a second ground path for grounding a component (e.g., the processor 120 and/or the audio module 170) mounted on the printed circuit board 340. The second ground path may be substantially the same as the second path P2. The second ground path may extend from the printed circuit board 340 to the battery 320 and electrically connect the printed circuit board 340 and the battery 320. At least a portion of the second ground path may be a conductive path formed on the flexible printed circuit board 346. The potential of the processor 120 and/or the audio module 170 may be kept the same as the battery 320 by the second ground path.

According to an embodiment, the electronic device 300 may include a first ground path P3 configured to ground the antenna 330. The first ground path P3 may electrically connect the antenna 330 to the printed circuit board 340 and/or the battery 320. According to an embodiment, at least a portion of the first ground path P3 may be an electrical path formed by electrically coupling the first connecting member 350 and the second connecting member 360 to each other. According to an embodiment, the first ground path P3 may be formed to pass through at least a portion of the printed circuit board 340. As the ground area of the antenna 330 is increased by the first ground path P3 and the length of the ground path is decreased, antenna performance (e.g., antenna gain) may be improved. According to an embodiment, the first connecting member 350 may be electrically connected to the second connecting member 360 using an electrical coupling by a dielectric material. According to an embodiment, the first ground path P3 may be substantially the same as the first path P1. According to an embodiment, at least a portion of the first ground path P3 may be referred to as an electrical path located in the battery 320, the flexible printed circuit board 346, the connector 347, the printed circuit board 340, and the antenna 330.

According to an embodiment, the first connecting member 350 may electrically connect the antenna 330 and the printed circuit board 340. For example, as the antenna 330 and the printed circuit board 340 are spaced apart from each other, the first connecting member 350 may electrically connect the antenna 330 and the printed circuit board 340. According to an embodiment, the first connecting member 350 may be referred to as an antenna connecting member.

According to an embodiment, the second connecting member 360 may electrically connect the battery 320 and the printed circuit board 340. For example, the battery 320 may be electrically connected to the power management module located in the battery 320 through the second connecting member 360. According to an embodiment, the second connecting member 360 may be referred to as a battery connection member. According to an embodiment, at least a portion of the first connecting member 350 may be disposed to overlap with at least a portion of the second connecting member 360. For example, at least a portion of the first connecting member 350 may be positioned above (+Z direction) at least a portion of the second connecting member 360.

According to an embodiment, the first connecting member 350 and/or the second connecting member 360 may be a c-clip as shown in FIGS. 4 and 5, but is not limited thereto. For example, the first connecting member 350 and/or the second connecting member 360 may include various types of members that electrically connect one component and another component to each other, such as a conductive wire or a pogo pin.

Figure 6:
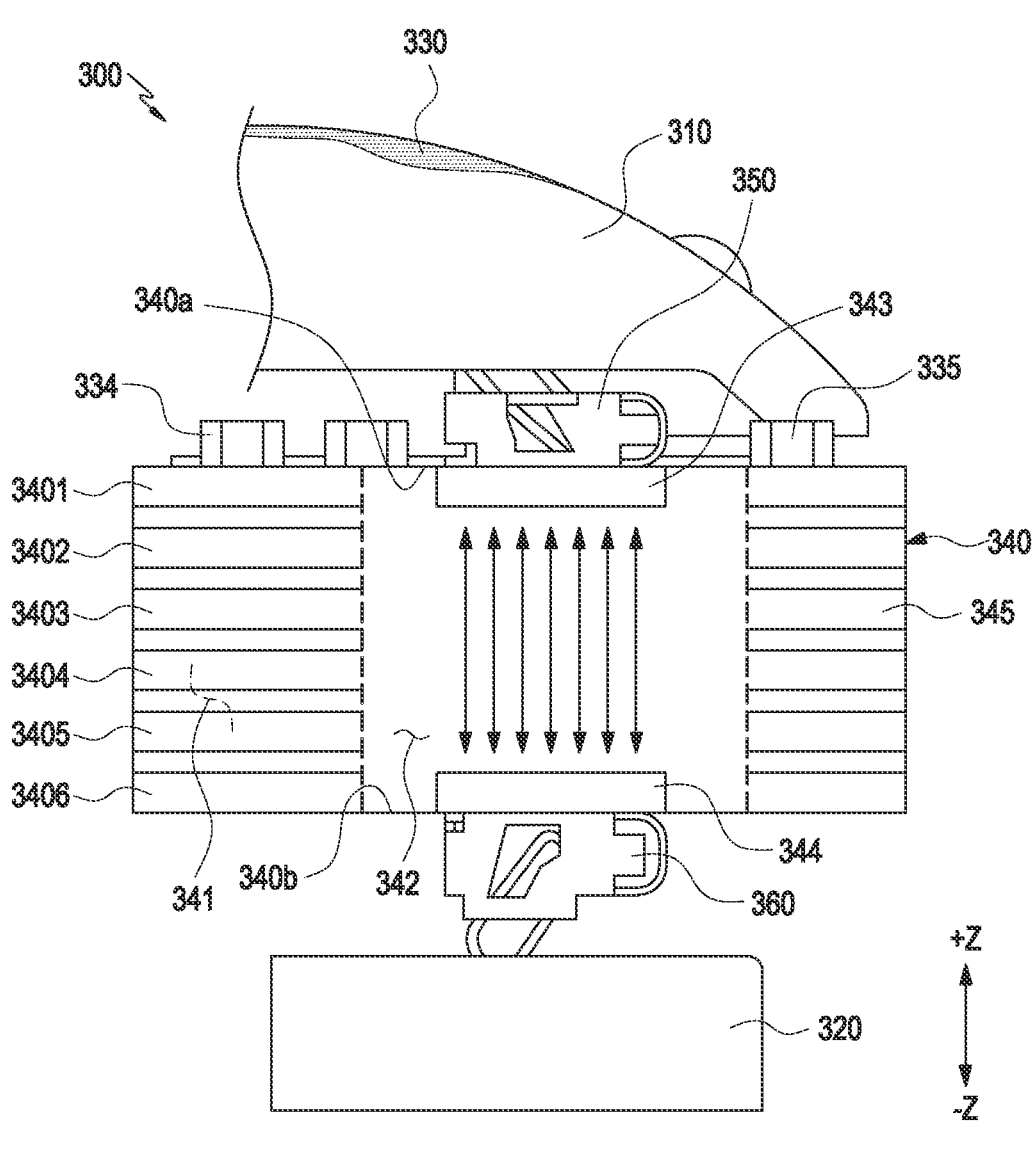
FIG. 6 is a schematic diagram of an electronic device including a printed circuit board and a connecting member according to an embodiment of the disclosure.
Figure 7A:
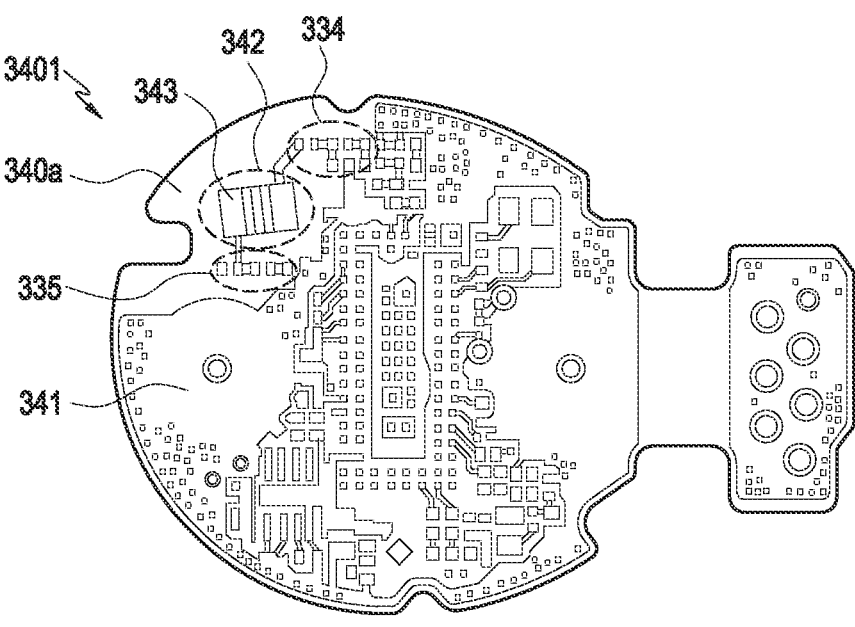
FIGS. 7A, 7B, 7C, 7D, 7E and 7F are diagrams illustrating a printed circuit board according to an embodiment of the disclosure.
Figure 7B:
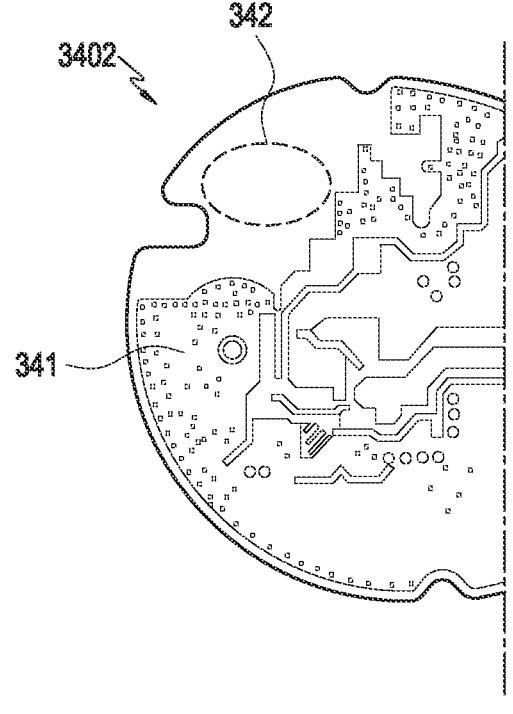
Figure 7C:
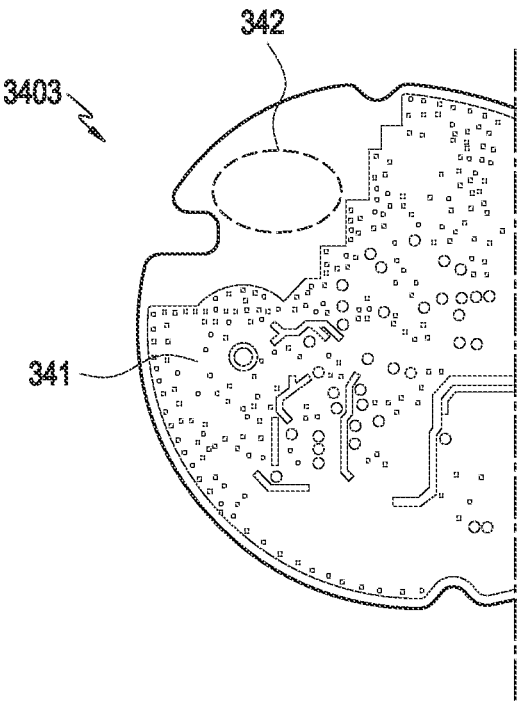
Figure 7D:
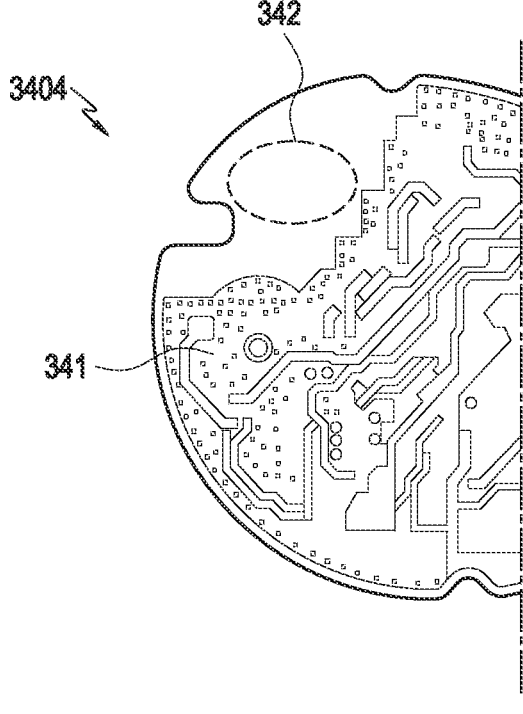
Figure 7E:
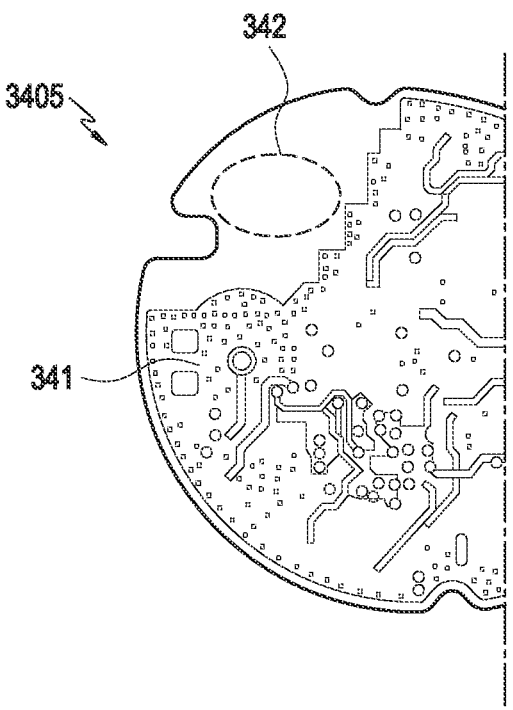
Figure 7F:
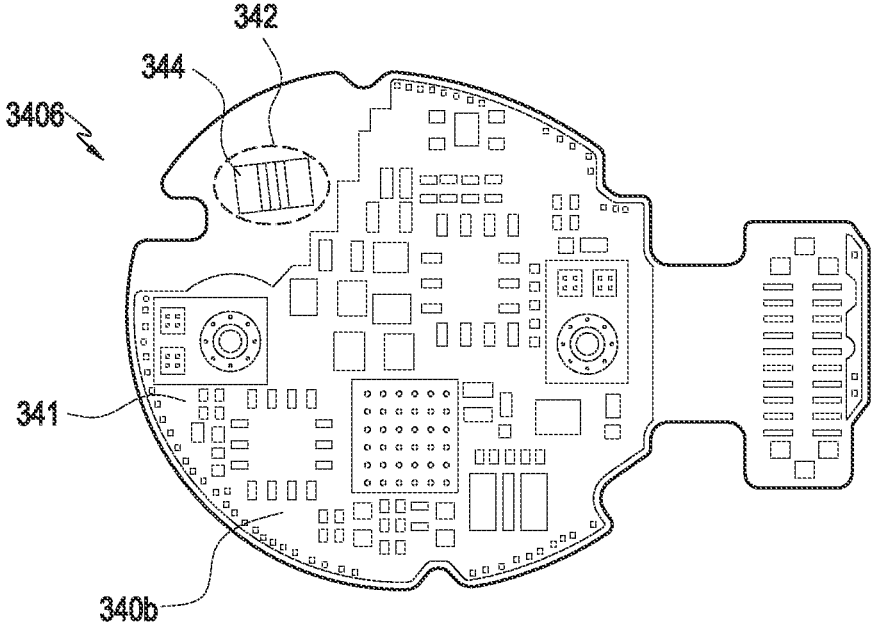

FIG. 6 is a schematic diagram of an electronic device including a printed circuit board and a connecting member according to an embodiment of the disclosure. FIGS. 7A to 7F are diagrams illustrating a printed circuit board according to an embodiment of the disclosure.

Referring to FIG. 6, the electronic device 300 may include a housing 310, a battery 320, an antenna 330, a printed circuit board 340, a first connecting member 350, and a second connecting member 360. The configurations of the electronic device 300 and the housing 310 of FIG. 6 may be entirely or partially the same as the configurations of the electronic device 300 and the housing 310 of FIGS. 3A and 3B.

According to an embodiment, a part of the printed circuit board 340 may not include a conductive pattern. For example, the printed circuit board 340 may include a first region 341 including a conductive pattern and a second region 342 including a dielectric material. According to an embodiment, the second region 342 may be located between the first connecting member 350 and the second connecting member 360. According to an embodiment, the second region 342 may include a first pad 343 and a second pad 344. According to another embodiment, the second region 342 may be located between the first pad 343 and the second pad 344. For example, the first connecting member 350 may be disposed on the upper portion (e.g., in the +Z direction) of the second region 342, and the second connecting member 360 may be disposed on the lower portion (e.g., in the −Z direction) of the second region 342. According to an embodiment, the second region 342 may be referred to as a fill-cut region from which the conductive pattern is removed from the printed circuit board 340. According to an embodiment, the first region 341 may surround at least a portion of the second region 342.

Referring to FIGS. 7A to 7F, the printed circuit board 340 may include a plurality of layers 3401, 3402, 3403, 3404, 3405, and 3406. For example, the printed circuit board 340 may include an upper layer 3401 facing the antenna 330 and a lower layer 3406 facing the battery 320. According to an embodiment, the upper layer 3401 may form the first surface 340a of the printed circuit board 340, and the lower layer 3406 may form the second surface 340b of the printed circuit board 340.

Figure 8:
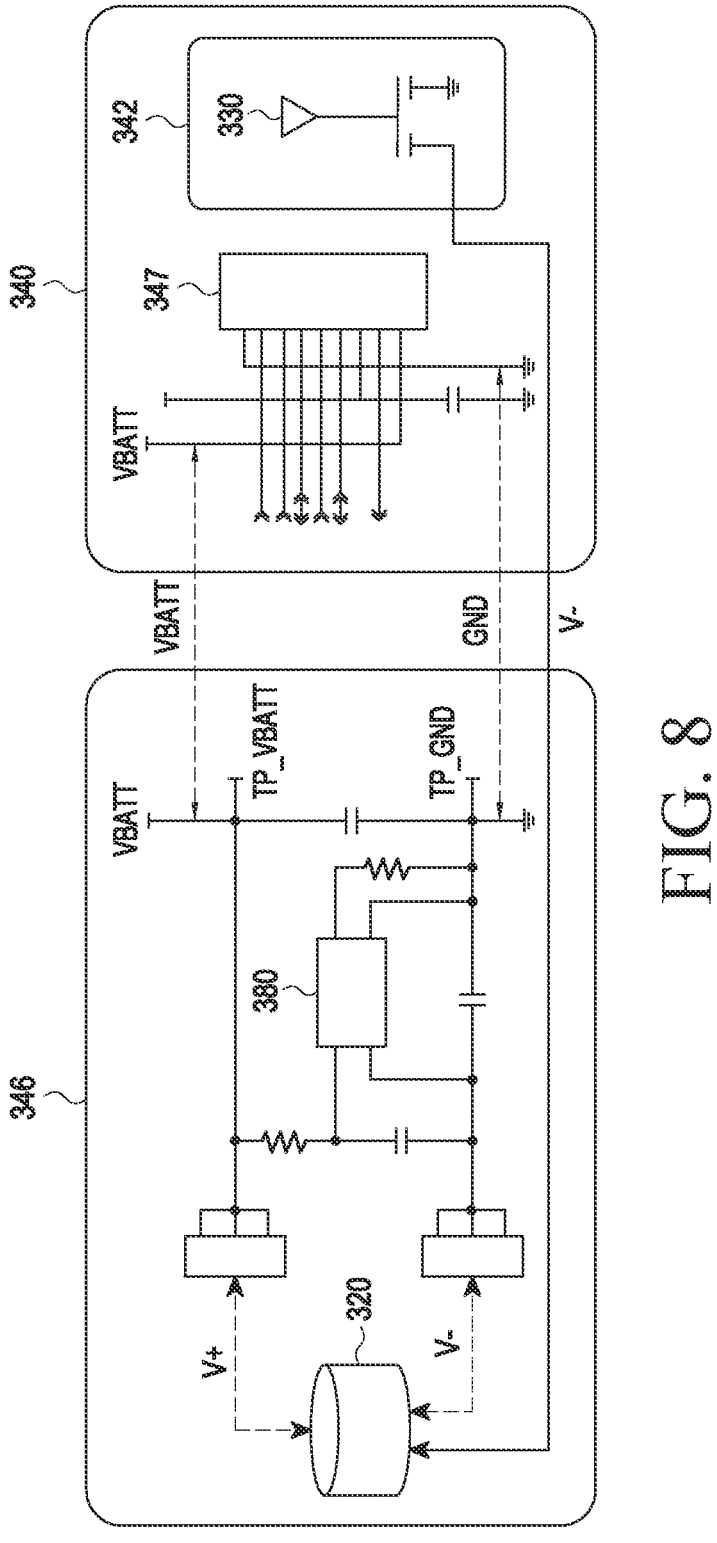
FIG. 8 is a circuit diagram of an electronic device according to an embodiment of the disclosure.

According to an embodiment, the printed circuit board 340 may include pads 343 and 344 for electrically connecting the connecting members 350 and 360 and the electronic components (e.g., the processor 120 of FIG. 1 and/or the power management module 380 of FIG. 8). For example, the printed circuit board 340 may include the first pad 343 connected to the first connecting member 350, and the second pad 344 connected to the second connecting member 360. According to an embodiment, the first pad 343 may be disposed on the upper layer 3401 of the printed circuit board 340, and the second pad 344 may be disposed on the lower layer 3406 of the printed circuit board 340. For example, the first pad 343 may be disposed in the second region 342 of the upper layer 3401, and the second pad 344 may be disposed in the second region 342 of the lower layer 3406. According to an embodiment, the first pad 343 may be referred to as an antenna pad, and the second pad 344 may be referred to as a battery pad. According to an embodiment, the first pad 343 may face the first connecting member 350 and may be spaced apart from the conductive pattern 345. The second pad 344 may face the second connecting member 360 and may be spaced apart from the conductive pattern 345.

According to an embodiment, the first pad 343 may be electrically connected to or coupled to the second pad 344. For example, at least a portion of a surge transmitted from the antenna 330 to the first pad 343 may be transmitted to the battery 320 through the second pad 344. As the first pad 343 is electrically connected to the second pad 344, a length of a conductive path between the antenna 330 and the battery 320 may be reduced. As the length of the conductive path is reduced, the antenna performance of the electronic device 300 may be improved. According to an embodiment, the first pad 343 may be interpreted as at least a portion of the first connecting member 350, and the second pad 344 may be interpreted as at least a portion of the second connecting member 360.

According to an embodiment, at least a portion of the first pad 343 may be disposed to overlap at least a portion of the second pad 344. For example, when the electronic device 300 is viewed from the top (e.g., in the Z-axis direction), the first pad 343 may face at least a portion of the second pad 344.

According to an embodiment, the first pad 343 and the second pad 344 may be disposed in the second region 342 of the printed circuit board 340. For example, the first pad 343 may be disposed in the second region 342 of the upper layer 3401, and the second pad 344 may be disposed in the second region 342 of the lower layer 3406. According to an embodiment, a second region 342 of a plurality of layers (e.g., the second layer 3402, the third layer 3403, the fourth layer 3404, and/or the fifth layer 3405) may be disposed between the first pad 343 and the second pad 344. By disposing the second region 342 including the dielectric material between the first pad 343 and the second pad 344, the electrical coupling force between the first pad 343 and the second pad 344 may be improved.

According to an embodiment, the first pad 343 may be formed to correspond to the second pad 344 one-to-one. For example, a size and/or shape of the first pad 343 may be substantially the same as a size and/or shape of the second pad 344.

According to an embodiment, the first pad 343 may be electrically connected to the conductive pattern 345 of the printed circuit board 340. For example, the first pad 343 may be electrically connected to a power feed 334 and a ground 335.

According to an embodiment, the second pad 344 may not be electrically connected to the conductive pattern 345 of the printed circuit board 340. For example, the second pad 344 may be electrically isolated from the conductive pattern 345 of the printed circuit board 340. The conductive pattern may be referred to as a signal wire and/or a ground wire.

Figure 9:
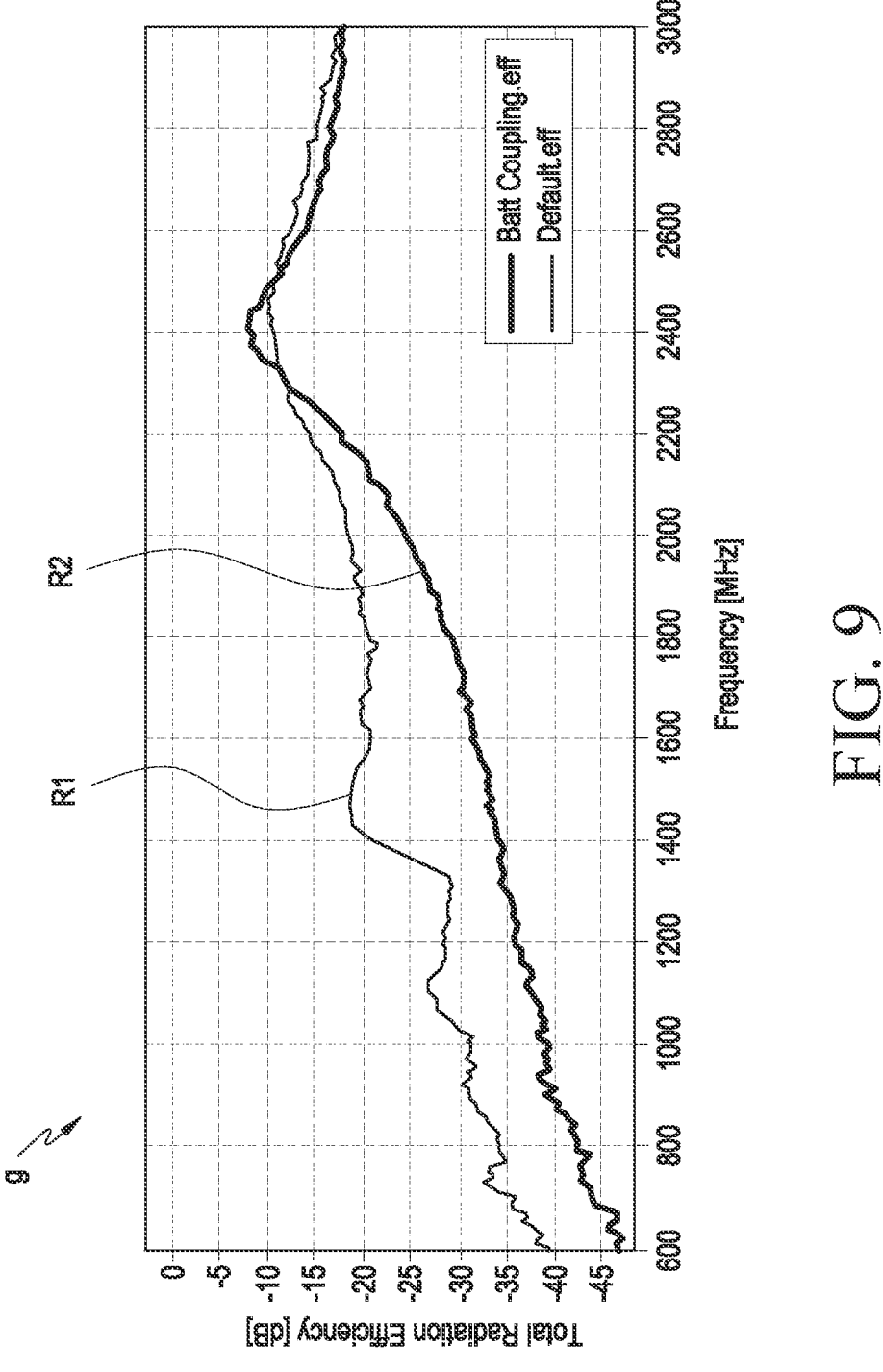
FIG. 9 is a graph illustrating an antenna radiation performance of an electronic device, according to an embodiment of the disclosure.

FIG. 8 is a circuit diagram of an electronic device according to an embodiment of the disclosure. FIG. 9 is a graph (g) illustrating an antenna radiation performance of an electronic device according to an embodiment of the disclosure. For example, FIG. 9 shows a first radiation efficiency R1 of the antenna of the electronic device that does not include a ground path using the first connecting member 350 and the second connecting member 360, and a second radiation efficiency R2 of the antenna (e.g., the antenna 330 of FIG. 4) of the electronic device (e.g., the electronic device 300 of FIG. 4) that includes the first connecting member 350 and/or the second connecting member 360.

Referring to FIG. 8 and/or FIG. 9, the electronic device 300 may include an electrical path (e.g., the first ground path P3 of FIG. 4) that electrically connects the battery 320 and the antenna 330. The configurations of the battery 320, the antenna 330, the printed circuit board 340, the flexible printed circuit board 346, and the power management module 380 of FIG. 8 may be entirely or partially the same as the configurations of the battery 320, the antenna 330, the printed circuit board 340, the flexible printed circuit board 346, and the power management module 380 of FIG. 4 and/or FIG. 5.

According to an embodiment, the electronic device 300 may provide the antenna 330 with reduced parasitic resonance. According to an embodiment, the radiation efficiency of the antenna 330 may be increased due to the first ground path P3. For example, the antenna 330 may receive a reference potential from the battery 320 using the first ground path P3. Due to the first ground path P3, a length of a path through which the antenna 330 receives the reference potential from the battery 320 is reduced, so that an electrical coupling force with the antenna 330 and/or the battery 320 of the printed circuit board 340 may be improved, and parasitic resonance may be reduced or prevented.

According to an embodiment, the power management module 380 may be connected to the flexible printed circuit board 346. For example, the battery 320 and the power management module 380 may be electrically connected to the flexible printed circuit board 346, and the flexible printed circuit board 346 may be electrically connected to the connector 347 of the printed circuit board 340. According to another embodiment, the power management module 380 may be disposed in the printed circuit board 340.

Referring to FIG. 9, in a predetermined band (e.g., about 2200 MHz to 2600 MHz), the second radiation efficiency R2 of the electronic device 300 that includes the first conductive path (e.g., the first ground path P3 of FIG. 4) may be higher than the first radiation efficiency R1 of the electronic device that does not include the ground path (e.g., the first ground path P3). For example, the second radiation efficiency R2 may be higher than the first radiation efficiency R1 by about 3 dB or more in a predetermined band (e.g., about 2200 MHz to 2600 MHz).

A wearable electronic device may include an antenna for communication with an external electronic device. However, as the wearable electronic device becomes increasingly more compact, electronic components disposed in the wearable electronic device are also more compact. As the wearable electronic device is reduced in size and has a smaller space in which electronic components may be disposed, a ground area used to ground an antenna may decrease, and thus performance of wireless communication may deteriorate. In the wearable electronic device, a battery may be used to ground the antenna. However, as a length of a ground path where the antenna is connected to the battery increases, an antenna performance may decrease, and parasitic resonance may occur.

Various embodiments of the disclosure are to provide a wearable electronic device capable of improving antenna performance and reducing parasitic resonance.

However, the problem to be solved in the disclosure is not limited to the above-mentioned problem, and may be variously expanded without departing from the spirit and scope of the disclosure.

According to various embodiments of the disclosure, an electronic device may improve antenna performance by increasing a grounded area based on a ground path formed based on a printed circuit board and a connecting member that is disposed on the printed circuit board and electrically connected to an antenna. Also, according to various embodiments of the disclosure, the electronic device may improve antenna performance and reduce parasitic resonance by reducing a length of the ground path based on a connecting member that is electrically connected to the antenna.

In addition, various effects identified directly or indirectly through the disclosure may be provided.

According to an embodiment of the disclosure, an electronic device (e.g., the electronic device 300 of FIG. 4) may include a housing (e.g., the housing 310 of FIG. 4), and a battery disposed in the housing (e.g., the battery 320 of FIG. 4), an antenna configured to communicate with an external electronic device (e.g., the antenna 330 of FIG. 5), a printed circuit board (the printed circuit board 340 of FIG. 4) that includes a first surface (e.g., the first surface 340a of FIG. 7A) facing the antenna, and a second surface (e.g. the second surface 340b of FIG. 7F) opposite to the first surface and facing the battery, a first connecting member (e.g. the first connecting member 350 of FIG. 4) disposed on the first surface and electrically connecting the antenna and the printed circuit board, and a second connecting member (e.g., the second connecting member 360 of FIG. 4) disposed on the second surface and electrically connecting the battery and the printed circuit board, at least a portion of which is disposed to overlap at least a portion of the first connecting member, wherein the printed circuit board may include a first region (e.g., the first region 341 of FIG. 5) including a conductive pattern (e.g., the conductive pattern 345 of FIG. 6), and a second region (e.g., the second region 342 of FIG. 5) including a dielectric material, the second region being at least partially located between the first connecting member and the second connecting member.

According to an embodiment, the printed circuit board may be configured to include a first pad (e.g., the first pad 343 of FIG. 6) connected to the first connecting member, and a second pad (e.g., the second pad 344 of FIG. 6) connected to the second connecting member, wherein the first pad is configured to be electrically coupled to the second pad.

According to an embodiment, the printed circuit board may include an upper layer (e.g., the upper layer 3401 of FIG. 6) providing the first surface, a lower layer (e.g., the lower layer 3406 of FIG. 6) providing the second surface, and at least one layer (e.g., the second layer 3402, the third layer 3403, the fourth layer 3404 and/or the fifth layer 3405 of FIG. 6) located between the upper layer and the lower layer, wherein the first pad is disposed on the upper layer, and the second pad is disposed on the lower layer.

According to an embodiment, the electronic device may further include a power feed electrically connected to the first pad, and a ground electrically connected to the first pad.

According to an embodiment, the second pad may be electrically isolated from the conductive pattern.

According to an embodiment, the first region may surround at least a portion of the second region, and the first pad and the second pad are spaced apart from the conductive pattern.

According to an embodiment, the printed circuit board may be disposed between the battery and the antenna.

According to an embodiment, the battery may include a first battery surface (e.g., the first battery surface 320a of FIG. 4) facing a first direction (e.g., +Z direction of FIG. 4) facing the printed circuit board, a second battery surface (e.g., the second battery surface 320b of FIG. 4) facing a second direction (e.g., −Z direction of FIG. 4) opposite to the first direction, a negative electrode (e.g., the negative electrode 321 of FIG. 4) located on the first battery surface and a positive electrode (e.g., the positive electrode 322 of FIG. 4) located on the second battery surface.

According to an embodiment, the electronic device may further include a power management circuit or a power management module (e.g., the power management module 380 of FIG. 8) for reducing overcharging of the battery.

According to an embodiment, the electronic device may further include a flexible circuit board (e.g., the flexible printed circuit board 346 of FIG. 4) connected to the battery and the printed circuit board, wherein the power management module may be connected to the flexible circuit board.

According to an embodiment, the antenna may include a lower antenna pattern (e.g., the lower antenna pattern 332 of FIG. 5) that is electrically connected to the first connecting member, an upper antenna pattern (e.g., the upper antenna pattern 331 of FIG. 5) that is closer than the lower antenna pattern to a surface of the housing, and a via structure (e.g., the via structure 333 of FIG. 5) that electrically connect the upper antenna pattern and the lower antenna pattern.

According to an embodiment, the first connecting member and the second connecting member may provide a first ground path (e.g., the first ground path (P3)) for the battery to provide a reference potential to the antenna.

According to an embodiment, the housing may include a protrusion (e.g., the protrusion 316 of FIG. 3A) which is configured to be at least partially inserted into a user's body.

According to an embodiment, the electronic device may further include an audio module (e.g., the audio module 170 of FIG. 2) disposed in the housing, wherein the audio module is configured to radiate sound to the outside of the electronic device using a recess positioned in the protrusion.

According to an embodiment, the antenna may be a laser direct structuring (LDS) antenna.

According to various embodiments of the disclosure, the electronic device (e.g., the electronic device 300 of FIG. 4) may include a housing (e.g., the housing 310 of FIG. 4), a battery (e.g., the battery 320 of FIG. 4) disposed in the housing, an antenna (e.g., the antenna 330 of FIG. 5) configured to communicate with an external electronic device, a printed circuit board (e.g., the printed circuit board 340 of FIG. 5) disposed between the battery and the antenna, the printed circuit board including a first pad (e.g., the first pad 343 of FIG. 6) facing the antenna, and a second pad (e.g., the second pad 344 of FIG. 6) facing the battery, a first connecting member (e.g., the first connecting member 350 of FIG. 6) disposed on the first pad, the first connecting member being electrically connected to the antenna, and a second connecting member (e.g., the second connecting member 360 of FIG. 6) disposed on the second pad, the second connecting member being electrically connected to the battery, wherein the printed circuit board comprises a first region (e.g., the first region 341 of FIG. 6) including a conductive pattern (e.g., the conductive pattern 345 of FIG. 6), and a second region (e.g., the second region 342 of FIG. 6) located between the first pad and the second pad and at least partially surrounded by the conductive pattern.

According to an embodiment, the printed circuit board may include an upper layer (e.g., the upper layer 3401 of FIG. 6), a lower layer (e.g., the lower layer 3406 of FIG. 6), and at least one layer (e.g., the second layer 3402, the third layer 3403, the fourth layer 3404 and/or the fifth layer 3405 of FIG. 6) disposed between the upper layer and the lower layer, wherein the first pad may be disposed on the upper layer, and the second pad may be disposed on the lower layer.

According to an embodiment, the electronic device may further include a power feed (e.g., the power feed 334 of FIG. 6) electrically connected to the first pad, and a ground (e.g., the ground 335 of FIG. 6) electrically connected to the first pad, wherein the second pad may be electrically isolated from the conductive pattern.

According to an embodiment, the first connecting member, the second connecting member, the first pad, and the second pad may provide a first ground path (e.g., the first ground path (P3) of FIG. 4) for the battery to provide a reference potential to the antenna.

According to an embodiment, the antenna may further include a lower antenna pattern (e.g., the lower antenna pattern 332 of FIG. 5) that is electrically connected to the first connecting member, an upper antenna pattern (e.g., the upper antenna pattern 331 of FIG. 5) that is closer than the lower antenna pattern to the surface of the housing; and a via structure (e.g., the via structure 333 of FIG. 5) that electrically connects the upper antenna pattern and the lower antenna pattern.

It will be apparent to one of ordinary skill in the art that the electronic device including the connecting member according to the disclosure as described above is not limited to the above-described embodiments and those shown in the drawings, and various changes, modifications, or alterations may be made thereto without departing from the scope of the present invention.

What is claimed is:

1. An electronic device comprising:
   a housing;
   a battery provided in the housing;
   an antenna;
   a printed circuit board comprising:
      a first surface facing a first direction in which the antenna is positioned;
      a second surface opposite to the first surface and facing the battery;
      a first region including a conductive pattern; and
      a second region including a dielectric material;
   a first connecting member provided on the first surface of the printed circuit board, the first connecting member electrically connecting the antenna and the printed circuit board; and
   a second connecting member provided on the second surface of the printed circuit board, the second connecting member electrically connecting the battery and the printed circuit board,
   wherein at least a portion of the second connecting member overlaps at least a portion of the first connecting member with respect to the first direction,
   wherein the second region is at least partially between the first connecting member and the second connecting member along the first direction, and
   wherein the antenna, the printed circuit board, and the battery overlap in the first direction.

2. The electronic device of claim 1, wherein the printed circuit board further comprises:
   a first pad connected to the first connecting member; and
   a second pad connected to the second connecting member, and
   wherein the first pad is electrically coupled to the second pad.

3. The electronic device of claim 2, wherein the printed circuit board further comprises:

an upper layer forming the first surface;

a lower layer forming the second surface; and at least one layer provided between the upper layer and the lower layer, and wherein the first pad is provided on the upper layer, and the second pad is provided on the lower layer.

4. The electronic device of claim 2, further comprising:

a power feed wire electrically connected to the first pad; and a ground wire electrically connected to the first pad.

5. The electronic device of claim 2, wherein the second pad is electrically isolated from the conductive pattern.

6. The electronic device of claim 2, wherein the first region surrounds at least a portion of the second region, and wherein the first pad and the second pad are spaced apart from the conductive pattern.

7. The electronic device of claim 1, wherein the printed circuit board is provided between the battery and the antenna.

8. The electronic device of claim 1, wherein the battery comprises:

a first battery surface facing the first direction toward the printed circuit board;

a second battery surface facing a second direction opposite to the first direction;

a negative electrode provided on the first battery surface; and a positive electrode provided on the second battery surface.

9. The electronic device of claim 1, further comprising a power management circuit configured to reduce overcharging of the battery.

10. The electronic device of claim 9, further comprising a flexible circuit board connected to the battery and the printed circuit board, wherein the power management circuit is connected to the flexible circuit board.

11. The electronic device of claim 1, wherein the antenna comprises:

a lower antenna pattern electrically connected to the first connecting member;

an upper antenna pattern closer than the lower antenna pattern to a surface of the housing; and a via structure electrically connecting the upper antenna pattern and the lower antenna pattern.

12. The electronic device of claim 1, wherein the first connecting member and the second connecting member are configured to provide a first ground path for the battery to provide a reference potential to the antenna.

13. The electronic device of claim 1, wherein the housing comprises a protrusion configured to be at least partially inserted into a body of a user.

14. The electronic device of claim 13, further comprising an audio module provided in the housing and configured to radiate sound to outside of the electronic device using a recess provided in the protrusion.

15. The electronic device of claim 1, wherein the antenna is a laser direct structuring antenna.

16. An electronic device comprising:

a housing;

a battery provided in the housing;

an antenna;

a printed circuit board provided between the battery and the antenna, the printed circuit board comprising:

a first pad facing the antenna;

a second pad facing the battery;

a first region including a conductive pattern; and a second region between the first pad and the second pad and at least partially surrounded by the conductive pattern;

a first connecting member provided on the first pad and electrically connected to the antenna; and a second connecting member provided on the second pad and electrically connected to the battery.

17. The electronic device of claim 16, wherein the printed circuit board further comprises:

an upper layer;

a lower layer; and at least one layer provided between the upper layer and the lower layer; and wherein the first pad is provided on the upper layer, and the second pad is provided on the lower layer.

18. The electronic device of claim 16, further comprising:

a power feed electrically connected to the first pad; and a ground electrically connected to the first pad, wherein the second pad is electrically isolated from the conductive pattern.

19. The electronic device of claim 16, wherein the first connecting member, the second connecting member, the first pad, and the second pad are configured to provide a first ground path for the battery to provide a reference potential to the antenna.

20. The electronic device of claim 16, wherein the antenna comprises:

a lower antenna pattern electrically connected to the first connecting member;

an upper antenna pattern closer than the lower antenna pattern to a surface of the housing; and a via structure electrically connecting the upper antenna pattern and the lower antenna pattern.

* * * * *